United States Patent
Wanka et al.

(10) Patent No.: US 11,290,055 B2
(45) Date of Patent: Mar. 29, 2022

(54) OPTICAL LIGHT-TRANSMISSION ELEMENT FOR A SOLAR ENERGY ASSEMBLY COMPRISING A HARVESTING PORTION AND AN ALIGNMENT CONTROL PORTION, AND METHOD FOR ALIGNMENT OF SUCH

(71) Applicant: Saint-Augustin Canada Electric Inc., Saint-Augustin de Desmaures (CA)

(72) Inventors: Sven Wanka, Freiburg (DE); Martin Neubauer, Freiburg (DE)

(73) Assignee: Saint-Augustin Canada Electric Inc., Saint-Augustin de Desmaures (CA)

( * ) Notice: Subject to any disclaimer, the term of this patent is extended or adjusted under 35 U.S.C. 154(b) by 0 days.

(21) Appl. No.: 15/745,324

(22) PCT Filed: Jul. 11, 2016

(86) PCT No.: PCT/CA2016/050807
§ 371 (c)(1),
(2) Date: Jan. 16, 2018

(87) PCT Pub. No.: WO2017/008151
PCT Pub. Date: Jan. 19, 2017

(65) Prior Publication Data
US 2018/0212561 A1    Jul. 26, 2018

(30) Foreign Application Priority Data
Jul. 15, 2015   (DE) ................. 102015213305.2

(51) Int. Cl.
*H02S 40/22*      (2014.01)
*H01L 31/054*    (2014.01)
(Continued)

(52) U.S. Cl.
CPC .............. *H02S 40/22* (2014.12); *F24S 23/10* (2018.05); *F24S 23/31* (2018.05);
(Continued)

(58) Field of Classification Search
CPC ..... H01L 31/0543; H02S 40/22; H02S 20/32; H02S 40/42; F24S 23/10; F24S 23/31; G02B 19/0014; G02B 19/0042
See application file for complete search history.

(56) References Cited

U.S. PATENT DOCUMENTS

| 5,707,458 A | 1/1998 | Nagashima et al. |
| 8,592,738 B1 | 11/2013 | Kozin et al. |

(Continued)

FOREIGN PATENT DOCUMENTS

| CN | 101859806 A | 10/2010 |
| EP | 1521044 A2 | 4/2005 |

(Continued)

OTHER PUBLICATIONS

European Extended Search Report for European Application No. 16823586.9, dated Oct. 31, 2018, 6 pages.

(Continued)

*Primary Examiner* — Niki Bakhtiari
(74) *Attorney, Agent, or Firm* — TraskBritt (57) ABSTRACT

An optical light-transmission element for a solar energy assembly having a solar cell includes at least one harvesting portion for directing solar light onto the solar cell. For optimum operation of the solar energy assembly, the optical light-transmission element and the solar cell have to be carefully aligned. In order to facilitate the alignment, the optical light-transmission element further comprises at least one alignment control portion for concentrating the solar light onto a second focusing region, which is spaced apart from the primary focusing region. A method for aligning (Continued)

such a solar energy assembly involves focusing light on a focusing region that is spaced apart from the solar cell, and adjusting at least one of the position of the solar cell and the harvesting region until the focusing region is located at a predetermined target zone, which is spaced apart from the solar cell.

17 Claims, 4 Drawing Sheets

(51) Int. Cl.
*F24S 23/00* (2018.01)
*F24S 23/30* (2018.01)
*H02S 20/32* (2014.01)
*G02B 19/00* (2006.01)
*H02S 40/42* (2014.01)
*G02B 3/08* (2006.01)

(52) U.S. Cl.
CPC ..... *G02B 19/0014* (2013.01); *G02B 19/0042* (2013.01); *H01L 31/0543* (2014.12); *H02S 20/32* (2014.12); *G02B 3/08* (2013.01); *H02S 40/42* (2014.12); *Y02E 10/40* (2013.01); *Y02E 10/52* (2013.01)

(56) References Cited

U.S. PATENT DOCUMENTS

| | | | |
|---|---|---|---|
| 2003/0117713 A1 | 6/2003 | Border et al. | |
| 2005/0081908 A1 | 4/2005 | Stewart | |
| 2005/0225864 A1 | 10/2005 | Kornrumpf | |
| 2008/0041441 A1 | 2/2008 | Schwartzman | |
| 2009/0159126 A1 | 6/2009 | Chan | |
| 2009/0250095 A1* | 10/2009 | Thorley | G02B 3/08 136/246 |
| 2010/0126556 A1* | 5/2010 | Benitez | H01L 31/0543 136/246 |
| 2011/0283517 A1* | 11/2011 | Shin | H01L 31/0543 29/464 |
| 2015/0085277 A1 | 3/2015 | Pardell Vilella | |
| 2015/0194531 A1 | 7/2015 | Toya et al. | |
| 2015/0270418 A1* | 9/2015 | Inagaki | H01L 31/022433 136/246 |

FOREIGN PATENT DOCUMENTS

| | | |
|---|---|---|
| EP | 1895597 A1 | 3/2008 |
| KR | 10-0913074 B1 | 8/2009 |
| WO | 2008152157 A1 | 12/2008 |

OTHER PUBLICATIONS

Chinese First Office Action and Search Report for Chinese Application No. 201680041529.5, dated Nov. 27, 2018, 13 pages.
International Search Report for International Application No. PCT/CA2016/050807 dated Sep. 26, 2016, 3 pages.
International Written Opinion for International Application No. PCT/CA2016/050807 dated Sep. 26, 2016, 4 pages.
German Search Report for German Application No. 102015213305.2 dated Jun. 23, 2016, 5 pages.
Office Action for Canadian Patent Application 2992101, dated Dec. 17, 2018, 3 pages.
Chinese 2nd Notification of Office Action for Chinese Application No. 201680041529.5 dated Aug. 14, 2019, 9 pages.
Canadian Office Action for Canadian Application No. 2,992,101 dated Feb. 6, 2020, 4 pages.
European Communication pursuant to Article 94(3) EPC for European Application No. 16823586, dated Jan. 10, 2020, 4 pages.
Chinese Office Action for Chinese Application No. 201680041529.5, dated Mar. 4, 2020, 5 pages.
Indian Examination Report for Indian Application No. 201847004736 dated Oct. 30, 2019, 5 pages.
CN Office Action for Chinese Application No. 201680041529.5 dated Aug. 3, 2020, 6 pages (with english translation).
Canadian Office Action for Canadian Application No. 2,992,101 dated Feb. 16, 2021, 4 pages.
Canadian Office Action from Canadian Application No. 2992101, dated Nov. 24, 2021, 4 pages.

* cited by examiner

OPTICAL LIGHT-TRANSMISSION ELEMENT FOR A SOLAR ENERGY ASSEMBLY COMPRISING A HARVESTING PORTION AND AN ALIGNMENT CONTROL PORTION, AND METHOD FOR ALIGNMENT OF SUCH

CROSS-REFERENCE TO RELATED APPLICATIONS

This application is a national phase entry under 35 U.S.C. § 371 of International Patent Application PCT/CA2016/050807, filed Jul. 11, 2016, designating the United States of America and published in English as International Patent Publication WO 2017/008151 A1 on Jan. 19, 2017, which claims the benefit under Article 8 of the Patent Cooperation Treaty to German Patent Application Serial No. 102015213305.2, filed Jul. 15, 2015.

TECHNICAL FIELD

The present disclosure is directed to an optical light-transmission element for a solar energy assembly.

BACKGROUND

Optical light-transmission elements of this kind are, for example, used in concentrator photovoltaics (CPV). In CPV, small, but highly efficient solar cells are combined with concentrator optics, which focus light onto a solar cell for harvesting the solar energy. The concentrator optics require a perfect alignment of the optics and the solar cell at the module manufacturing process. During use, the CPV modules have to be continuously adjusted to the position of the sun using a tracker mechanism in order to keep the sunlight focused on the solar cell. Any lens-to-cell misalignment, resulting from manufacturing or tracker misalignment that is not compensated by an extra active area of the solar cell, reduces the output power of the module.

A solution to control the alignment of the module can be done during manufacture by using the location of the lens center or the focal point of the CPV lenses relative to the cell. A camera looks through the lens and optical recognition software calculates the misalignment.

The initial alignment of the tracker is done by using a similar principle. With a mirror that is fixedly installed in the module, a technician can look by eye onto the cell and adjust the module brackets in a way that the light spots are centered on the solar cells.

Both the alignment during manufacture and the initial tracker alignment are prone to errors. Further, current CPV development envisages the use of a so-called secondary optics (reflective and/or refractive) close to the cell in order to increase and/or homogenize the light flux on the cell. However, such secondary optics introduces shading effects that make current alignment procedures difficult or even impossible. Thus, there is a need to develop new suitable techniques. Moreover, if the optical light-transmission element uses non-focusing optics, no reference point is available for alignment.

BRIEF SUMMARY

In view of these disadvantages, it is the object of the disclosure to provide an optical light-transmission element that facilitates alignment, both during manufacture and on the tracker.

According to the disclosure, the element is divided functionally into two distinctive parts. The harvesting portion is used for harvesting solar energy in that it allows passing or, depending on the configuration, focusing the solar energy onto a solar cell. The harvesting portion may be a non-focusing optical member or a focusing member, e.g., a Fresnel or TIR (total internal reflection) lens. The alignment control portion concentrates solar energy onto a focusing region that is spaced apart from the solar cell and, thus, can be more readily used for alignment purposes. If the harvesting region comprises focusing optics that result in a focusing region, then the focusing region of the alignment control region may be spaced apart from the focusing region of the harvesting portion, preferably in the plane defined by the focal length of the harvesting portion.

The optical light-transmission element may include an array of harvesting portions that are each associated with a single solar cell. The array may be associated with a single alignment control portion for adjusting the array as a whole and/or with a plurality of alignment control portions for adjusting individual harvesting portions. In particular, an array of harvesting portions that share one alignment control portion may be monolithically connected to each other. If a more individual alignment control is desired, there may be an alignment control portion for each harvesting portion.

Additional modifications to embodiments of the present disclosure are possible. For example, the alignment control portion may be restricted to lie within a circumference of the harvesting portion, wherein the circumference determines the aperture, i.e., in the active area of the harvesting portion. This facilitates assembling several harvesting portions into an array by allowing for seamless tiling of the harvesting portions adjacent to each other. Alternatively or cumulatively, the alignment control portion may be at least partly arranged outside the circumference. If it is desired to utilize the full active area of the lens, the alignment control portion may also be situated completely outside the circumference, e.g., between neighboring harvesting portions in an array and/or outside the circumference of the array.

The active area and/or the alignment control portion may have multi-axial, in particular, rotational symmetry to facilitate assembly of the lens area into an array irrespective of the orientation of the light-transmission element. According to another embodiment, the harvesting portion may have a polygonal active area determining its aperture. In such an embodiment, the alignment control portion may be at least partly located at the corners of the polygonal area, either within the active area, or outside of this area, or reaching across the circumference of this area.

For the alignment control portion to work, only a very small area compared to the active area of the harvesting portion may be needed. For example, the alignment control portion may comprise exactly one Fresnel or TIR (total internal reflection) prism of a Fresnel or TIR lens. For an efficient alignment control, it certainly seems unnecessary to have more than ten Fresnel or TIR prisms assigned to the alignment control portion. The size of the alignment control portion is determined by the brightness of its focusing region that is needed for proper adjustment procedures.

The alignment control portion may be at least one of an eccentric and a concentric lens with respect to the harvesting portion.

In the following, embodiments of the disclosure are described exemplarily with reference to the drawings. Various features that develop the invention further may be omitted or added depending on the particular application.

BRIEF DESCRIPTION OF THE DRAWINGS

Throughout the drawings, the same reference numerals are used for elements that are identical in their construction and/or their function. In the drawings.

DETAILED DESCRIPTION

First, the structure and function of an optical light-transmission element 1 according to the disclosure and a solar energy assembly 2 comprising the optical light-transmission element 1 are explained with reference to FIG. 1.

In addition to the optical light-transmission element 1, the solar energy assembly 2 may comprise, at its front side 3, which is directed toward the incident light 4 providing the solar energy, a preferably transparent glass plate 5. The optical light-transmission element 1 may be arranged on an inner side 6, opposite the front side 3, of the glass plate 5, e.g., by bonding. It may be manufactured from a transparent resin material.

Further, the solar energy assembly 2 may include a solar cell 7 for harvesting the solar energy of the incident light 4. The solar cell 7 may be arranged on a plate 8 made from heat-conducting material such as metal. The plate 8 may form a heat sink 9 to dissipate thermal energy that could not be converted into usable energy by the solar cell 7. At a back side 10, which faces away from the incident light 4, of the solar energy assembly 2, another glass plate 11 may be arranged, which may be at least partially translucent.

The solar cell 7 is spaced apart from the optical light-transmission element 1 by a distance 12. The resulting volume 13 may be gas-filled or evacuated.

The optical light-transmission element 1 is functionally divided into two parts. The first part serves as a harvesting portion 14 for allowing passage of and/or directing the incident light 4 onto the solar cell 7. The harvesting portion 14 may be configured as a lens focusing the light onto the solar cell 7, as indicated by the triangle 15. In such a case, the distance 12 may be determined by the focal length of the harvesting portion 14.

Figure 1:
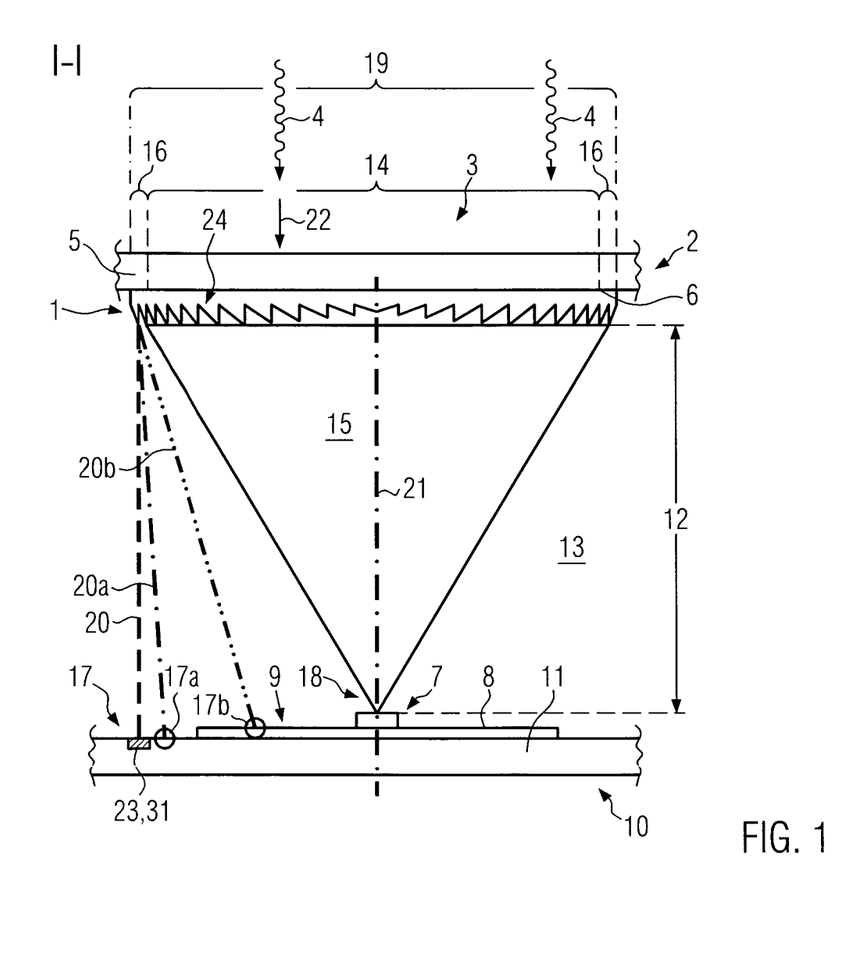
FIG. 1 shows a solar energy assembly using an optical light-transmission element according to the disclosure in a schematic cut view along the line 1-1 of FIG. 2.

FIG. 1 exemplarily shows that the harvesting portion 14 may consist of, or comprise, a Fresnel or TIR (total internal reflection) lens. However, it is also possible that the harvesting portion 14 comprises non-focusing optics and the concentration of the incident light 4 onto the solar cell 7 is done by additional elements.

The second part of the optical light-transmission element 1 serves as an alignment control portion 16. The alignment control portion 16 focuses part of the incident light 4 onto a focusing region 17 that is spaced apart from the solar cell 7 or, if the harvesting portion 14 comprises a focusing optics, from a focusing region 18 of the harvesting portion 14. Usually, the solar cell 7 and the focusing region 18 coincide. The alignment control portion 16 may actually comprise several disconnected regions.

Figure 2:
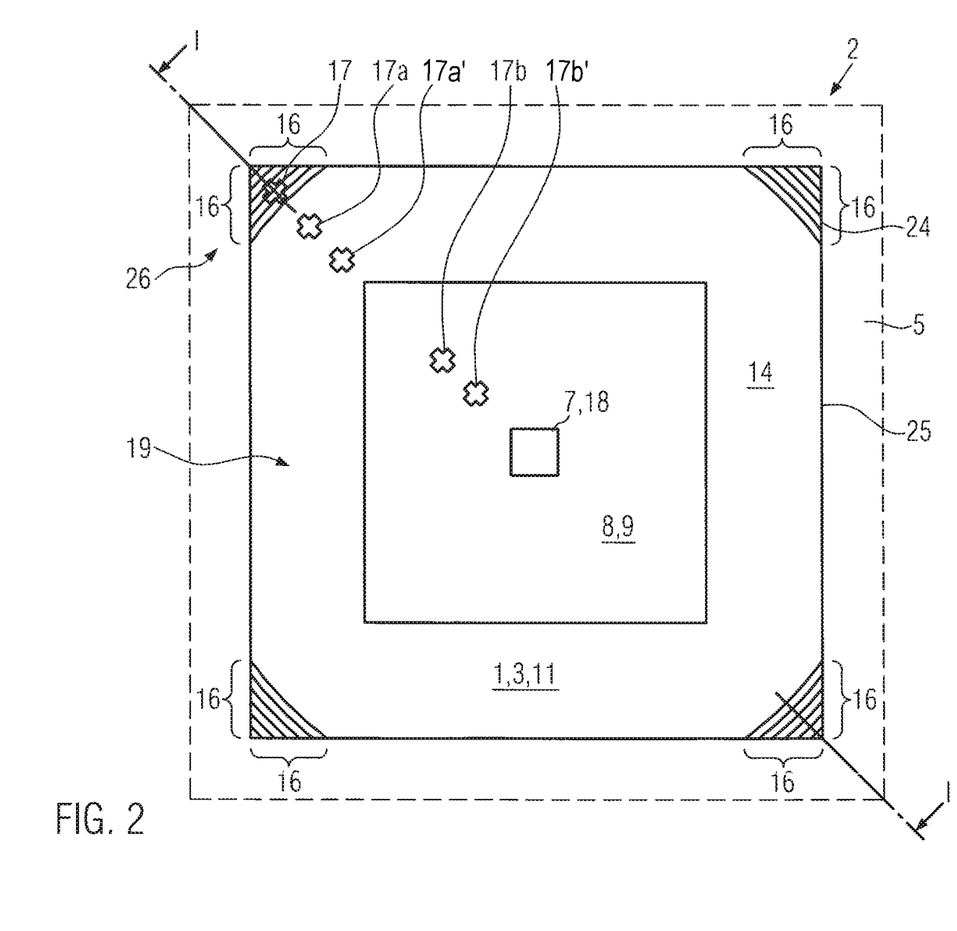
FIG. 2 shows a schematic plan view of the solar energy assembly of FIG. 1.

Depending on the configuration of the alignment control portion 16, the focusing region 17 may be a single coherent area or may comprise several disconnected areas. In the latter case, each of the disconnected areas that make up the focusing region 17 may be associated with a respective disconnected region of the alignment control portion 16. Alternatively, a subset of the disconnected regions of the alignment control portion 16 may focus on the same area of the focusing region 17. FIG. 2 shows an example of possible locations of the focusing region 17 associated to the alignment control portion 16 in the upper left corner.

The location of the focusing region 17 serves as representation for the location of the solar cell 7. For this, the offset between the focusing region 17 and the solar cell 7 needs to be well-defined. To achieve an accurate offset that is stable over a larger number of product samples, the geometry of the alignment control portion 16 needs to be within tight tolerances, which requires accurate manufacturing.

The amount of energy that the optical harvesting element 1 is capable of collecting is determined by the size of an active area 19 through which the incident light 4 passes. This size determines the aperture of the harvesting portion 14. In order not to compromise the energy harvest from the incident light 4, the alignment control portion 16 only occupies a small amount of the active area 19, preferably less than 1/10 of this area, or the alignment control portion 16 can be totally or partly arranged outside the active area 19.

FIG. 1 shows, for explanatory purposes only, that the focusing region 17 of the alignment control portion 16 may be located directly underneath the alignment control portion 16 in the direction of the incident light 4, so that the optical axis 20 of the alignment control portion 16 is parallel to the optical axis 21 of the harvesting portion 14.

However, the direction of the optical axis 20 of the alignment control portion 16 may, in other embodiments, deviate from the direction of the optical axis 21 of the harvesting portion 14 as is exemplified by the dot-dashed lines 20a and 20b of optical axes in FIG. 1. This may become necessary if the focusing region 17 of the alignment control portion 16 should be positioned at a specific location, e.g., to achieve better visibility.

The focusing region 17 is situated outside the solar cell 7, e.g., either on the back glass plate 11 as indicated by the reference numeral 17a, or on the heat sink 9, as indicated by the reference numeral 17b. The focusing region 17a on the back glass plate 11 may be viewed from either the edge of front glass plate 5 or from the back side 10, if the glass plate 11 has some translucency. The focusing region 17b on the heat sink 9 may be observed by looking into the assembly 2 from the edge of the front side or from the backside using internal mirrors.

By diverting a small portion of the incident light 4 onto the second focusing region 17 by means of the alignment control portion 16, the alignment of the optical light-transmission element 1 with respect to the solar cell 7 is greatly facilitated. The alignment is exact, if the light of the alignment control portion 16 is focusing in a target zone 23, which may be visibly marked. The shape of the target zone 23 may correspond to the shape of the second focusing region 17 to facilitate the alignment process. For example, the second focusing region 17 may be annular having an internal section, which is sized to accommodate the solar cell 7. Such an internal section may not be illuminated by the alignment control portion 16 but still be illuminated by the harvesting portion 14. In such an instance, the target zone 23 may be a ring extending around the solar cell 7. Again, alignment is achieved if the second focusing region 17 and the target zone 23 collapse.

For alignment during manufacture, a rear assembly comprising the solar cell 7 and at least one of the heat sink 9 and the back plate 11 have to be moved relative to the optical light transmission element 1 until the focusing region 17 of the alignment control portion 16 coincides with the target zone 23. At initial tracker alignment, the assembly 2 has to be tilted toward the incident light 4 until the focusing region 17 hits the target zone 23. The alignment control even works if the harvesting portion 14 comprises a non-focusing optics or the focusing region 18 is covered by additional elements, such as, for instance, secondary optics as pointed out above.

Further, the focusing region 17 may facilitate for automatic tracking, e.g., by placing an array of light-sensitive sensors (not shown) in the target zone 23. Any movement of the focusing region 17 can thus be automatically detected by the sensors and used by a control device to drive a tracker mechanism.

The optical light-transmission element 1 and/or the harvesting portion 14 and/or the alignment control portion 16 comprise optical elements that, in combination, produce the optical effect desired for the light-transmission element 1, the harvesting portion 14 and/or the alignment control portion 16. If, for example, the light transmission element 1, the harvesting portion 14 and/or the alignment control portion 16 are formed as a Fresnel or TIR lens, the optical elements are one or several prisms 24, which may be ring-shaped or ring sections. The prisms 24 may be precision-cut.

In particular, the alignment control portion 16 may comprise at least one prism 24. For good visibility of the focusing region 17, between 1 and 10 prisms may be necessary.

The alignment control portion 16 or its at least one prism 24 may form a lens that is concentric or eccentric with respect to the lens formed by the harvesting portion 14.

If the alignment control portion 16 comprises at least one prism 24, the slope is preferably larger or equal to 0° and considerably smaller than the angle of the neighboring active prisms 24 of the harvesting portion 14. An angle of 0° leads to an optical axis 20, which is parallel to the direction 22 of the incident light 4.

If an angle is larger than 0°, or an optical axis 20a, 20b deviating from the direction 22 of the incident light 4 is used in the alignment control portion 16, it is preferred that a symmetric arrangement of the alignment control portion 16 is used, e.g., by sub-dividing the alignment control portion 16 into symmetrically distributed sub-portions.

FIG. 2 shows a plan view upon the front side 3 of the solar energy assembly 2 of FIG. 1.

From FIG. 2, it can be seen that the location of the focusing region 17 of an alignment control portion 16 having an inclined optical axis 20a, 20b (FIG. 1) is temperature-dependent. With a change of temperature, the focusing region 17a is displaced from its original location 17a to another location 17a'. Likewise, the focusing region 17b may be displaced upon a temperature change to a location 17b'.

It can be further seen from FIG. 2 that the optical light-transmission element 1, or its active area 19, respectively, may be of polygonal shape, in particular, rectangular. The alignment control portion 16 may be located at a circumference 25 of the active area 19, for example, at corners 26 if the active area 19 is polygonal. In the embodiment shown, the alignment control portion 16 comprises discrete triangular regions that are located in all four corners 26. Variants of this embodiment may include less regions, e.g., at only one, two or three corners. All regions focus their light onto the focusing region 17.

In another alternative, the solar energy assembly 2 as shown in FIG. 2 may have more than one focusing region 17 per solar cell 7. This can be accomplished if the alignment control portion 16 focuses the lights onto two or more focusing regions 17. For example, each pair of two diagonally opposing corner regions may have a separate focusing region 17.

Figure 3:
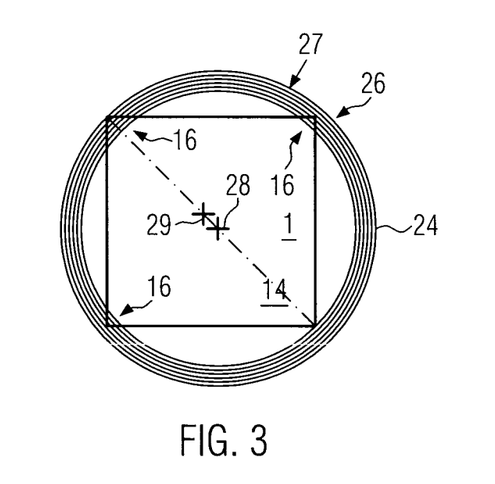
FIG. 3 shows a schematic plan view of an embodiment of an alignment control portion in an optical light-transmission element according to the disclosure.

FIG. 3 indicates how an alignment control portion 16 in the form of an eccentric lens with respect to the harvesting portion 14 may be formed: the alignment control portion 16 results from the intersection of a ring-shaped, preferably circular focusing lens 27 with the optical light-transmission element 1. Such intersections give rise to the alignment control portions 16 and may result in equally distributed portions at the corners of the optical light-transmission element 1. This is the case if the ring-shaped lens 27 is realized by a succession of ring-like or ring section-like Fresnel or TIR prisms 24, following the prisms 24 of the harvesting portion 14 as indicated in FIG. 1. However, by cutting out the optical light-transmission element 1 from a structure formed of prisms 24, the inner part defining the harvesting portion 14 and the outer part the alignment control portion 16, the center 28 of the lens 27, i.e., the alignment control portion 16, may also be shifted with respect to the geometrical center 29 of the active area 19. Due to the shift of the center 28, some corners 26 are provided with a larger area of the alignment control portion 16 than other corners 26. Some corners 26 may even be without an alignment control portion 16. This can be used to increase the active area of the harvesting portion 14 with respect to the optical light-transmission element 1. Alternatively or additionally to a shift, the optical axis 20 (FIG. 1) of the lens 27 may be inclined with respect to the optical axis 21 of the harvesting portion 14, as was explained above.

The alignment control portion 16 thus results from a modified structure of the optical light-transmission element 1, e.g., by an abrupt change in the angle of the surface of the element 1 or in the angle of the prisms 24.

By restricting the alignment control portion 16 to the circumference 25 and/or the corners 26, it is ensured that the main portion of the incident light 4 may directly pass through the optical light-transmission element 1 to the solar cell 7 and the aperture of the harvesting portion 14 is not overly compromised.

In a solar energy assembly 2, several solar cells 7 and the corresponding harvesting portion 14 may be combined into an array. In such a case, one harvesting portion 14 may be provided for each solar cell 7. The optical light-transmission element 1 may comprise a single harvesting portion 14, or a plurality of harvesting portions 14 may be combined into a single optical light-transmission element 1, either monolithically or by mounting a plurality of separate harvesting portions 14 together, e.g., by using a frame (not shown).

Figure 4:
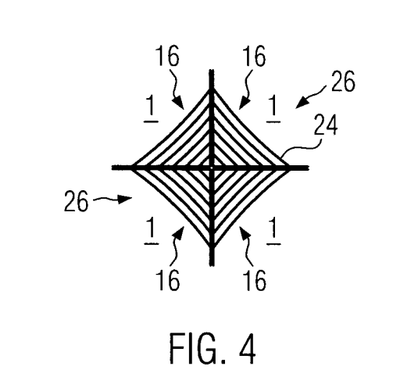
FIG. 4 shows a schematic plan view of another embodiment of alignment control portions tiled together.

If several optical light-transmission elements 1 are tiled together side-by-side to form an array, the respective alignment control portions 16 may meet at the corners as shown in FIG. 4. The actual number of prisms 24 in each corner 26 varies depending on, e.g., the shift of the geometrical center 29 of the alignment control portion 16 as explained in FIG. 3, if an eccentric lens is used.

As a modification to the embodiment shown in FIG. 4, the alignment control portions 16 meeting at the corners 26 may not belong to separate lenses but, in combination, form a lens that is centered on the tips of the abutting corners. For this, the curvature of the prisms 24 shown in FIG. 4 may be reversed so that concentric circles about the tips of the corners are formed.

In the embodiment of FIG. 4, the structure of the alignment control portion 16 is located in the aperture of the active area 19 (FIG. 2), in each corner 26. This may lead to an energy loss. This energy loss may be reduced if the alignment control portion 16 is not arranged symmetrically, but shifted, as shown in FIG. 3, so that some corners 26 do not feature an alignment control portion 16.

Figure 5:
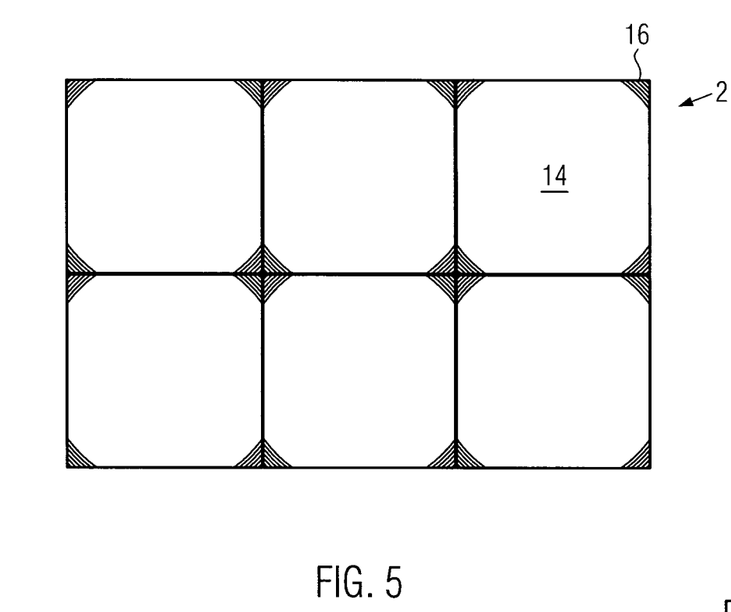
FIG. 5 shows a schematic plan view of a full array of the embodiment of alignment control portions tiled together as shown in FIG. 4.

FIG. 5 shows a solar energy assembly 2 that comprises a plurality of harvesting regions 14. The harvesting regions 14 are tiled to form an array. Each harvesting portion 14 may be provided with an alignment control portion 16. This can be used for an individual alignment of each solar cell 7 and its associated harvesting portion 14. Each alignment control portion 16 forms an optical element with its own optical axis 20 (FIG. 2) and its own focusing region 17.

Figure 6:
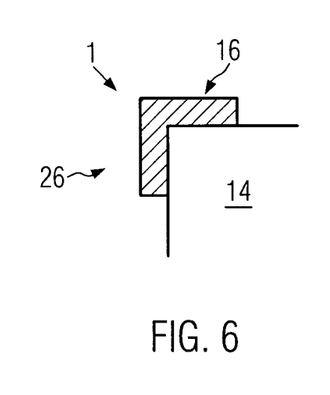
FIG. 6 shows a schematic plan view of another embodiment of an alignment control portion located outside the active area.

Energy loss may be reduced if the alignment control portion 16 is located outside, partially or completely, of the circumference 25 of the active area 19. FIG. 6 shows such an arrangement. The alignment control portion 16 may be located again at a corner 26 or along another portion of the circumference 25. Instead of being a triangular area, the alignment control portion 16 extends strip-like along the circumference 25 at one or more of the corners 26. The alignment control portion 16 may also form a frame that encircles a single harvesting portion 14 or a plurality of harvesting portions 14.

If, however, several harvesting portions 14 are systematically rigidly combined within tight tolerances, a lesser number of alignment control portions 16 may be sufficient. For example, if a number of harvesting portions 14 is monolithically combined, it may be sufficient that this combination is provided with only one or two alignment control portions 16. Such an embodiment is exemplarily shown in FIG. 7, where the alignment control portion 16 is arranged outside of the combined apertures or outside of the circumference 25 of the array of harvesting portions 14.

Figure 7:
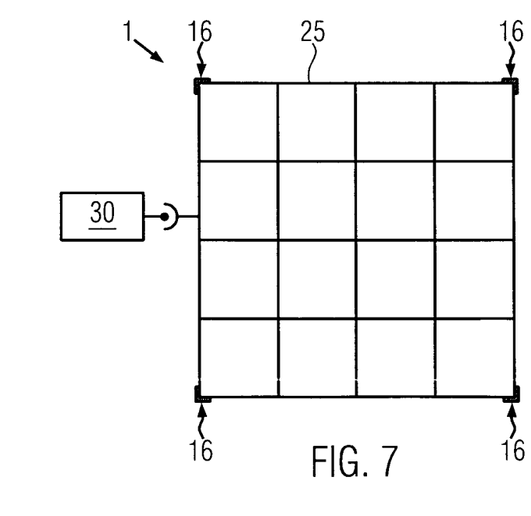
FIG. 7 shows a schematic plan view of a full array of the embodiment of alignment control portions located outside the active area as shown in FIG. 6.

As shown exemplarily in FIG. 7, the solar energy assembly 2 may comprise a tracker device 30 that is adapted to move the optical light-transmission element 1 or the complete solar energy assembly 2 toward the incident light 4. The latter device may be controlled by the deviation of the location of the focusing region 17 from the target zone 23. For acquiring the deviation, light-sensitive sensors 31 (FIG. 1) may be located at and/or around the target zone 23.

Although the alignment control portion 16 has been shown to be situated at the corners 26 in the above regions, it is also possible that the alignment control portion 16 is located within the active area 19 by modifying the structure provided for the harvesting portion 14 at one or more locations in the active area 19. For example, the alignment control portion 16 may comprise an outer lens 27, which lies within the active area 19, the harvesting portion 14 bordering on the outside and inside perimeter of the lens 27.

REFERENCE NUMERALS

1 Optical light-transmission element
2 Solar energy assembly
3 Front side
4 Incident light/solar light
5 Glass plate
6 Inner side of glass plate
7 Solar cell
8 Plate
9 Heat sink
10 Back side
11 Back glass plate
12 Distance
13 Volume
14 Harvesting portion
15 Light cone
16 Alignment control portion
17, 17a, 17a', 17b, 17b' Focusing region of alignment control portion
18 Focusing region of harvesting portion
19 Active area
20, 20a, 20b Optical axis of alignment control portion
21 Optical axis of harvesting portion
22 Direction of incident light
23 target zone
24 Smallest element forming the light transmission element 1 (e.g., prism).
25 Circumference
26 Corner
27 Lens
28 Geometrical center of alignment control portion 16
29 Geometrical center of active area 19
30 Tracker device
31 Light sensitive sensor

The invention claimed is:

1. An optical light-transmission element for a solar energy assembly with at least one solar cell, comprising:
    at least one harvesting portion for directing solar light onto the at least one solar cell; and
    at least one alignment control portion for concentrating solar light onto a focusing region, the focusing region being spaced apart from the at least one solar cell;
    wherein the at least one alignment control portion is formed by a modification of a structure of the at least one harvesting portion.

2. The optical light-transmission element of claim 1, wherein the optical axis of the at least one alignment control portion is displaced in at least one of direction and location with respect to the optical axis of the at least one harvesting portion.

3. The optical light-transmission element of claim 2, wherein a ratio of a surface area of the at least one harvesting portion to a surface area of the at least one alignment control portion is at least 10:1.

4. The optical light-transmission element of claim 3, wherein the optical light-transmission element is polygonal, and wherein the at least one alignment control portion is located at least at one corner.

5. The optical light-transmission element of claim 4, wherein the at least one harvesting portion is comprised within a circumference determining aperture, in the active area of the harvesting portion, and wherein the at least one alignment control portion is located at the circumference.

6. The optical light-transmission element of claim 5, wherein the at least one alignment control portion comprises at least one prism.

7. The optical light-transmission element of claim 6, wherein the optical light-transmission element comprises an array of harvesting portions, and wherein at least two alignment control portions are arranged between at least two harvesting portions.

8. The optical light-transmission element of claim 1, wherein a ratio of a surface area of the at least one harvesting portion to a surface area of the at least one alignment control portion is at least 10:1.

9. The optical light-transmission element of claim 1, wherein the optical light-transmission element is polygonal and in that the at least one alignment control portion is located at least at one corner.

10. The optical light-transmission element of claim 1, wherein the at least one harvesting portion is comprised within a circumference and in that the at least one alignment control portion is located at the circumference.

11. The optical light-transmission element of claim 1, wherein the at least one alignment control portion comprises at least one prism.

12. The optical light-transmission element of claim 1, wherein the optical light-transmission element comprises an array of harvesting portions, and wherein at least two alignment control portions are arranged between at least two harvesting portions.

13. A solar energy assembly, comprising:
  at least one optical light-transmission element according to claim 1; and
  at least one solar cell; and
  wherein the focusing region of the at least one alignment control region is spaced apart from the at least one solar cell.

14. The solar energy assembly of claim 13, wherein the focusing region of the at least one alignment control region is visible from at least one of a front side and a back side of the solar energy assembly.

15. The solar energy assembly of claim 13, further comprising a tracker device adapted to orientate the optical light-transmission element or the entire solar energy assembly toward the solar light, wherein the tracker device is adapted to tilt the optical light-transmission element or the entire solar energy assembly depending on a deviation between a location of the focusing region and a location of a target zone that is fixed relative to the at least one solar cell.

16. A method for aligning a solar energy assembly comprising an optical light transmission element according to claim 1, the method comprising:
  focusing light on a focusing region that is spaced apart from the solar cell; and
  adjusting at least one of the position of the solar cell and the harvesting portion until the focusing region is located at a predetermined target zone, which is spaced apart from the solar cell.

17. The method of claim 16, further comprising tracking solar light with the solar energy assembly as a function of a deviation between the locations of the target zone and the focusing region.

* * * * *